(12) United States Patent
Sone et al.

(10) Patent No.: US 6,411,077 B1
(45) Date of Patent: Jun. 25, 2002

(54) OPTICAL-VOLTAGE SENSOR

(75) Inventors: Isamu Sone, Hitachi; Masaru Higaki, Kitakyushu, both of (JP)

(73) Assignee: Hitachi, Ltd., Tokyo (JP)

( * ) Notice: Subject to any disclaimer, the term of this patent is extended or adjusted under 35 U.S.C. 154(b) by 0 days.

(21) Appl. No.: 09/520,035

(22) Filed: Mar. 6, 2000

(30) Foreign Application Priority Data

Mar. 9, 1999 (JP) .......................................... 11-061372

(51) Int. Cl.$^7$ ................................................ G01R 31/00
(52) U.S. Cl. ...................................... 324/96; 324/117 R
(58) Field of Search .............................. 324/96, 158.1, 324/73.1, 244.1, 750, 752, 765, 117 R; 250/231.1, 227.21; 356/365; 359/257

(56) References Cited

U.S. PATENT DOCUMENTS

| | | | |
|---|---|---|---|
| 5,153,427 A | * 10/1992 | Takahashi et al. | ........ 250/131.1 |
| 5,477,134 A | * 12/1995 | Hamada | ...................... 324/96 |
| 5,635,829 A | * 6/1997 | Hamada | ...................... 324/96 |
| 5,726,723 A | * 3/1998 | Wang et al. | ................... 349/75 |

FOREIGN PATENT DOCUMENTS

| | | | | |
|---|---|---|---|---|
| JP | 06050999 A | * | 2/1994 | .................. 324/96 |
| JP | 6-258352 | | 9/1994 | |
| JP | 7-280852 | | 10/1995 | |

* cited by examiner

*Primary Examiner*—Michael J. Sherry
*Assistant Examiner*—Minh N. Tang
(74) *Attorney, Agent, or Firm*—Mattingly, Stanger & Malur, P.C.

(57) ABSTRACT

An optical-voltage sensor having a simple structure and being capable of being formed by directly laminating highly sensitive electro-optical elements is disclosed. The optical-voltage sensor includes a light source 1, a polarizer 2, a ¼ wavelength plate 3, an analyzer 5, and an O/E converting portion. Two electro-optical elements 4a, 4b are arranged adjacent to each other along a light transmitting direction between the ¼ wavelength plate 3 and analyzer 5. Transparent electrodes 7 are attached to front and back surfaces of each of the electro-optical elements 4a, 4b, and voltages having a magnitude equal to one another and a polarity opposite to one another are applied to the electro-optical elements 4a, 4b from a power supply 8a and a power supply 8b, respectively.

2 Claims, 4 Drawing Sheets

OPTICAL-VOLTAGE SENSOR

BACKGROUND OF THE INVENTION

1. Field of the Invention

The present invention relates to an optical-voltage sensor for measuring a voltage with high accuracy and, more particularly to an optical-voltage sensor aimed at high sensitivity using an electro-optic crystal having a natural optical rotatory power.

2. Related Background Art

There are some crystals in which a plane of polarization of linearly polarized light is rotated as the light travels when the light is transmitted through the crystals. This physical property is called as the natural optical rotatory power (hereinafter, referred to as optical rotatory power), and the angle of rotation of the linear polarization plane is called as the angle of optical rotation. An angle of optical rotation is proportional to a thickness of the crystal in a light transmission direction (hereinafter, referred to as a light path length). On the other hand, the optical-voltage sensor utilizes the electro-optical effect (Pockels effect) that the transmitted light is phase-modulated by applying a voltage to the electro-optical crystal. When the electro-optical crystal having the optical rotatory power is used for an optical-voltage sensor, handling of the optical rotatory power becomes important for the optical-voltage sensor because the both phenomena appear at a time.

However, since the measurement sensitivity of the optical-voltage sensor is decreased by the optical rotatory power, various kinds of ideas to prevent the decrease have been studied. For example, the "Optical Fiber Sensor" Information Research Committee (1985) proposes that in order to prevent the decrease in measurement sensitivity by the optical rotatory power, the optical path length of an element is set to a value less than 2 mm when a single crystal of $Bi_{12}GeO_{20}$ (hereinafter, referred to as BGO) or $Bi_{12}SiO_{20}$ (hereinafter, referred to as BSO) is used. This first prior art intends that the effect on the sensitivity of the optical-voltage sensor is reduced by shortening the optical path length to make the angle of optical rotation smaller.

Further, from the viewpoint that the maximum sensitive angle of the electro-optical effect is changed by the optical rotatory power, Japanese Patent Application Laid-Open No.6-258352 and Japanese Patent Application Laid-Open No.7-280852 propose a method of reducing the effect of the angle of optical rotation that the electro-optical element is rotated in a direction inverse to the angle of optical rotation by ½ of the angle of optical rotation. Moreover, in cases of improving the sensitivity by laminating the electro-optical elements, Japanese Patent Application Laid-Open No.6-258352 and Japanese Patent Application Laid-Open No.7-280852 propose a method that the electro-optical elements are laminated by rotating each of the elements step by step, and a method that electro-optical crystals cut with shifting the crystal orientation are laminated without rotating. These second prior arts are an idea that the crystal orientations of the electro-optical elements are arranged so as to maximize the sensitivity.

Among the above-mentioned prior arts, the shortening of the optical path length in the first prior art means that the thickness of the element is thinned. However, thinning of the thickness of element means increasing of the intensity of electric field in inverse proportion to the thickness of element when the applied voltage is constant. Therefore, there is a problem in that the reliability of insulation is reduced when the electric field is high.

On the other hand, the second prior arts have a problem in that the structure of the optical-voltage sensor becomes complex because the electro-optical crystals are laminated with inclining the crystal orientations. Further, the method of using the electro-optical crystals cut with shifting the crystal orientation has a problem that the fabrication accuracy is difficult to maintain and the quality control becomes complex. In general, the element having required size is formed by cutting a single crystal ingot in a direction of the crystal orientation. Furthermore, both of the proposed methods have a problem in that electric insulator is necessary to be placed between the laminated electro-optical elements and accordingly the structure becomes complex.

An object of the present invention is to make a measurement sensitivity of an electro-optical element higher and to provide an optical-voltage sensor having a simple structure capable of being formed by directly laminating the highly sensitive electro-optical elements.

SUMMARY OF THE INVENTION

In order to attain the above object, the present invention is characterized by an optical-voltage sensor comprising a polarizer for converting incident light into linearly polarized light; a ¼ wavelength plate for converting the linearly polarized light into circular polarized light; electro-optical elements to transmit the circular polarized light therethrough and to perform phase modulation of the light corresponding to a voltage applied to transparent electrodes in the both surfaces; and an analyzer for sensing light transmitted through the electro-optical elements, wherein two of the electro-optical elements are arranged adjacently to each other along a transmitting direction of the light, and a voltage to be measured is applied to each of the two electro-optical elements at a time with a polarity opposite to each other.

According to the structure described above, because the voltage to be measured is applied to the two electro-optical elements arranged adjacently to each other along the transmitting direction of the light at a time with a polarity opposite to each other, the Pockels effects are produced in the electro-optical elements with an inverse polarity and accordingly the degree of modulation can be increased even if the angle of optical rotation is increased. Thereby, the measurement sensitivity of the optical-voltage sensor can be increased.

As the method of producing the Pockels effects with an inverse polarity, in addition to the method of applying the voltage to be measured to each of the electro-optical elements with a polarity opposite to each other, as described above, there is another method that a crystal surface of one of the electro-optical elements is arranged inclining by 90 degrees with respect to that of the other of the electro-optical elements, and the voltage to be measured is applied to the both electro-optical elements with an equal polarity. That is, the present invention is characterized by an optical-voltage sensor having the structure similar to the optical-voltage sensor described above, wherein two of the electro-optical elements are arranged adjacently to each other along a transmitting direction of the light, and the two electro-optical elements are arranged so that an angle difference between crystal orientations of the electro-optical elements becomes 90 degrees in a plane perpendicular to the transmitting direction of the light, and a voltage to be measured is applied to each of the two electro-optical elements at a time with an equal polarity. In such a structure, the Pockels effects are also produced in the electro-optical elements adjacent to each other with an inverse polarity. Therefore, the measurement sensitivity of the optical-voltage sensor can be increased.

Further, the present invention is characterized by an optical-voltage sensor having the structure similar to the optical-voltage sensor described above, wherein an even number of the electro-optical elements are arranged continuously along a transmitting direction of the light, and a voltage to be measured is applied to each of the even number of electro-optical elements at a time with polarities opposite to each other with respect to adjacent electro-optical elements.

According to the structure described above, because the voltage to be measured is applied to the electro-optical elements adjacently to each other among the even number of electro-optical elements arranged continuously along a transmitting direction of the light at a time with a polarity opposite to each other, the Pockels effects are produced in the electro-optical elements with an inverse polarity and accordingly the degree of modulation can be increased even if the angle of optical rotation is increased. Thereby, the measurement sensitivity of the optical-voltage sensor can be increased.

Further, the present invention is characterized by an optical-voltage sensor having the structure similar to the optical-voltage sensor described above, wherein an even number of the electro-optical elements are arranged continuously along a transmitting direction of the light, and the even number of electro-optical elements are arranged so that crystal orientations of the even number of electro-optical elements are rotated by 90 degrees in a plane perpendicular to the transmitting direction of the light, and a voltage to be measured is applied to each of the even number of electro-optical elements at a time with an equal polarity. In such a structure, the Pockels effects are also produced in the electro-optical elements adjacent to each other with an inverse polarity. Therefore, the measurement sensitivity of the optical-voltage sensor can be increased.

Furthermore, the present invention is characterized by that the electro-optical element is formed so that a thickness of the electro-optical element in the transmitting direction of the light corresponds to an angle of natural optical rotatory power larger than 45 degrees. The construction as described above is effective to increase the degree of modulation.

DESCRIPTION OF THE PREFERRED EMBODIMENTS

Embodiments of the present invention will be described below, referring to the accompanied drawings.

Figure 6:
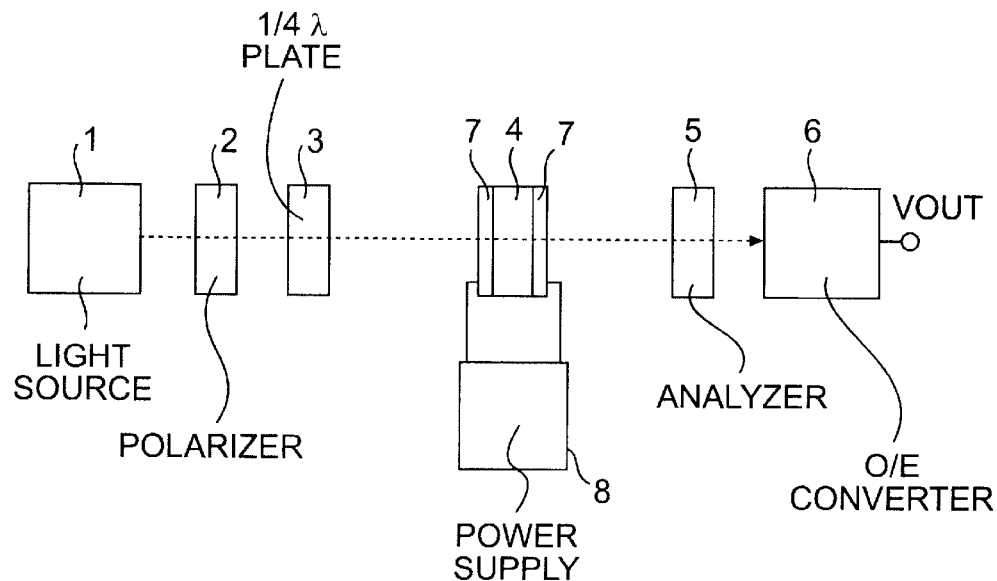
FIG. 6 is a diagram showing the basic structure of an optical-voltage sensor in accordance with the present invention.

Initially, the relationship between an degree of modulation and an angle of analyzer will be explained in taking an optical-voltage sensor using one electro-optical element without optical rotatory power. FIG. 6 shows the basic structure of the optical-voltage sensor. FIG. 6 shows the relative relationship among a light source 1, a polarizer 2, a ¼ wavelength plate 3, an electro-optical element 4, an analyzer 5, and an O/E converting part 6. Transparent electrodes 7 are attached on the both surface of the electro-optical element, and a voltage is applied to the transparent electrodes from a power supply 8.

Figure 7:
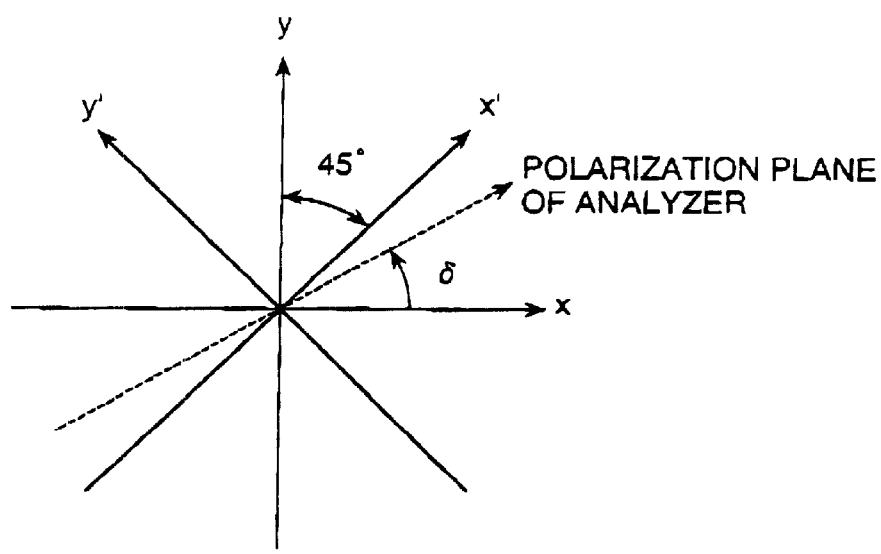
FIG. 7 is a graph showing the relative relationship among a crystal axis, a main axis of an index ellipsoid and a polarization plane of an analyzer.
Figure 8:
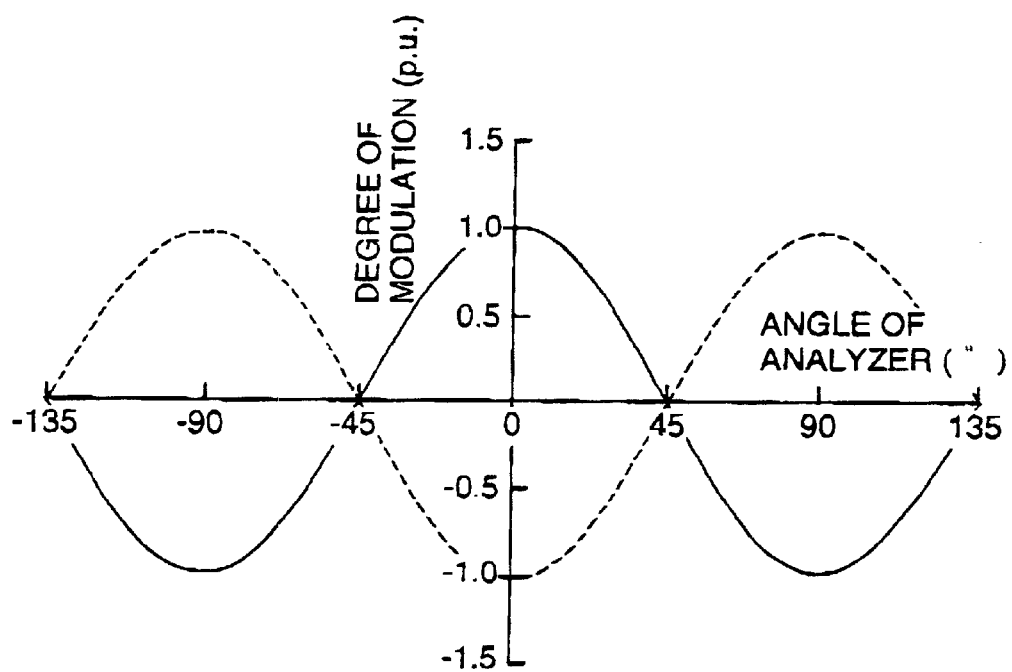
FIG. 8 is a graph showing the relationship between a degree of modulation and an angle of an analyzer in a case of one element without optical rotatory power.

FIG. 7 shows the relative relationship among a crystal axis (x, y) of the electro-optical element 4, a main axis (x', y') of an index ellipsoid, and an angle $\delta$ of analyzer 5 in the optical-voltage sensor shown in FIG. 6. The angle $\delta$ of analyzer is defined as an angle of the polarization plane of the analyzer with respect to the polarization plane (the x-axis) of the polarizer. FIG. 8 shows the relationship between a degree of modulation of an measurement sensitivity of the optical-voltage sensor and an angle $\delta$ of analyzer expressed by normalizing with the maximum degree of modulation. FIG. 8 shows that when the natural optical rotatory power does not exist, the degree of modulation is changed by the angle $\delta$ of analyzer and the polarity of the degree of modulation is reversed by the polarity of the applied voltage.

On the other hand, in the electro-optical element having the optical rotatory power, the plane of polarization is affected by the Pockels effect while being optically rotated. Therefore, letting the angle of optical rotation be $\Phi$, and the angle of analyzer be $\delta$, the degree of modulation can be obtained by integrating the value in FIG. 8 from $-\Phi+\delta$ to $\delta$. Therefore, the degree of modulation becomes maximum when $\delta=\Phi/2$, which agrees with the explanation on the second prior art.

In a common optical-voltage sensor, the angle of analyzer $\delta$ is generally set to 0° (degree) and 90° in order to simplify the structure. In that case, it can be understood from FIG. 8 that the degree of modulation becomes small when the angle $\Phi$ of optical rotation exceeds 45°. Therefore, it is effective to decrease the angle $\Phi$ of optical rotation, and the method of thinning the thickness of the element is generally employed, as in the first prior art.

However, when the voltage applied to the element is changed to the inverse polarity, the characteristic becomes as shown by the dashed line. Therefore, by combining two elements so as to show the inverse Pockels effect to each other (the relationship between the solid line and the dashed line in FIG. 8), the degree of modulation can be increased even if the angle of optical rotation is increased.

Embodiment 1

A first embodiment of the present invention will be described below, referring to FIG. 1. The optical-voltage sensor of the present embodiment comprises a light source 1, a polarizer 2, a ¼ wavelength plate 3, an analyzer 5, and an O/E converting part 6. Two electro-optical elements 4a, 4b are arranged adjacent to each other along a transmitting direction of light between the ¼ wavelength plate 3 and the analyzer 5. Transparent electrodes 7 are attached to front and back surfaces of each of the electro-optical elements 4a, 4b along the light transmitting direction, and voltages having a magnitude equal to and a polarity opposite to each other are applied at a time to the electro-optical element 4a in the polarizer 3 side and the electro-optical element 4b in the analyzer 5 side from a power supply 8a and a power supply 8b, respectively. The optical-voltage sensor of the present embodiment measures the voltage of the power supplies 8a, 8b.

In the case of one element without the natural optical rotatory power, the Pockels effect of the electro-optical element 4a has the dependency of angle of analyzer shown by the solid line in FIG. 8 and the Pockels effect of the electro-optical element 4b has the dependency of angle of analyzer shown by the dashed line. Since each of the electro-optical elements 4a, 4b has the natural optical rotatory power, the composite Pockels effect for the structure of FIG. 1 can be given by a value integrated the degree of modulation shown by the solid line from $-2\Phi+\delta$ to $-\Phi+\delta$ and integrated the degree of modulation shown by the dashed line from $-\Phi+\delta$ to $\delta$. In the case of the angle of optical rotation $\Phi=45°$, the Pockels effect at the angle of analyzer $\delta=0°$ or $90°$ is the sum of the dashed line and the solid line which is twice as large as the degree of modulation in the case of one element. Therefore, that the angle of optical rotation $\Phi$ for one element is above $45°$ is a necessary condition for increasing the degree of modulation.

An experimental result obtained by using a light-emitting diode of 860 nm wavelength as the light source 1 and applying a direct current voltage of 500 V to a BSO of 5 mm light path length will be shown here. The angle of optical rotation for one BSO element was 56°.

Figure 2:
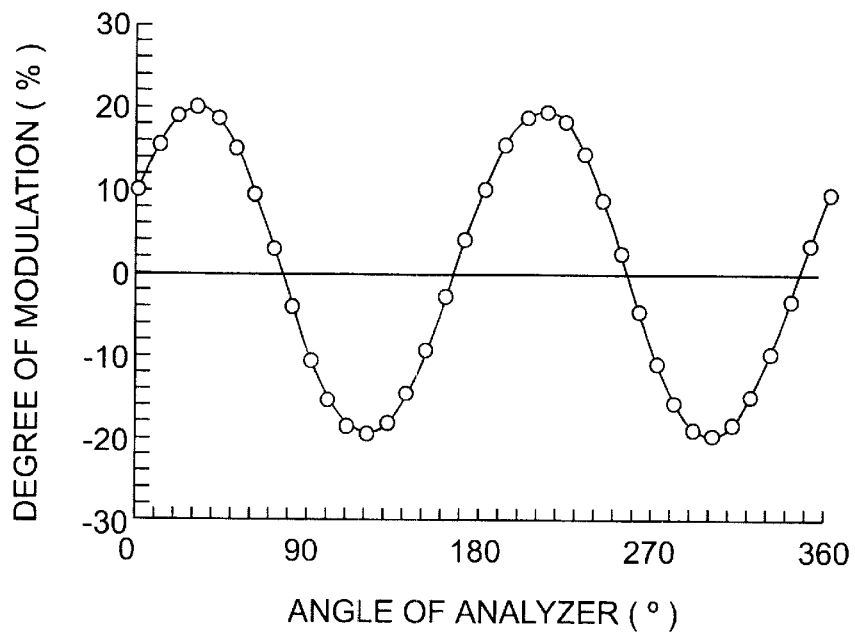
FIG. 2 is a graph showing an experimental result using a BSO element in accordance with the present invention.

Initially, a case of one BSO element, as shown in FIG. 6, will be explained. Letting the output voltage without applied voltage be Vo and the output voltage with applied voltage be Vx, and defining the degree of modulation m (%) as (Vx−Vo)/Vo×100, the relationship between the degree of modulation and the angle of analyzer became as shown in FIG. 2. In this experimental result, the angle of analyzer δ at a maximum value of the degree of modulation was 28° and the degree of modulation was approximately 20%. The degree of modulation at the angle of analyzer δ=0° was approximately 10%.

Figure 1:
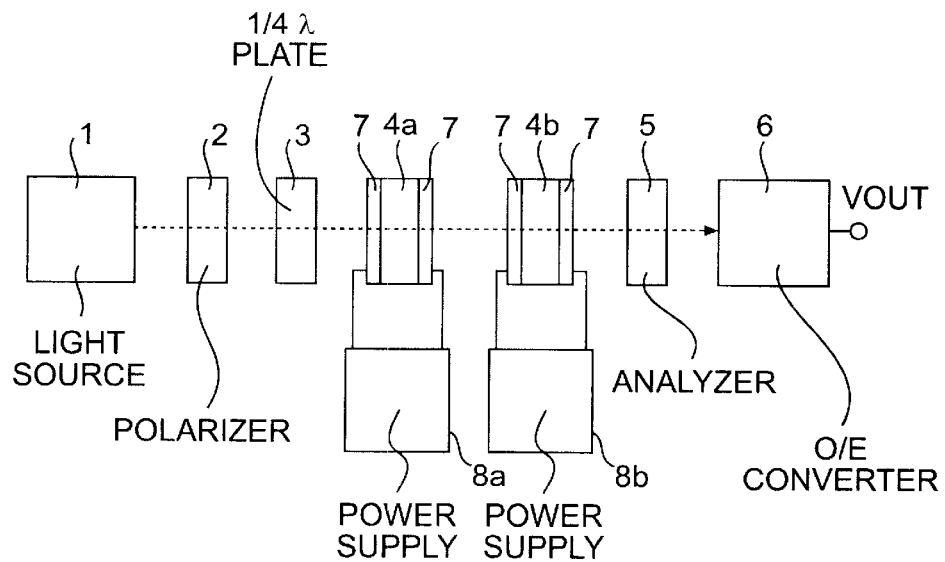
FIG. 1 is a schematic diagram showing the structure of a first embodiment of an optical-voltage sensor in accordance with the present invention.
Figure 3:
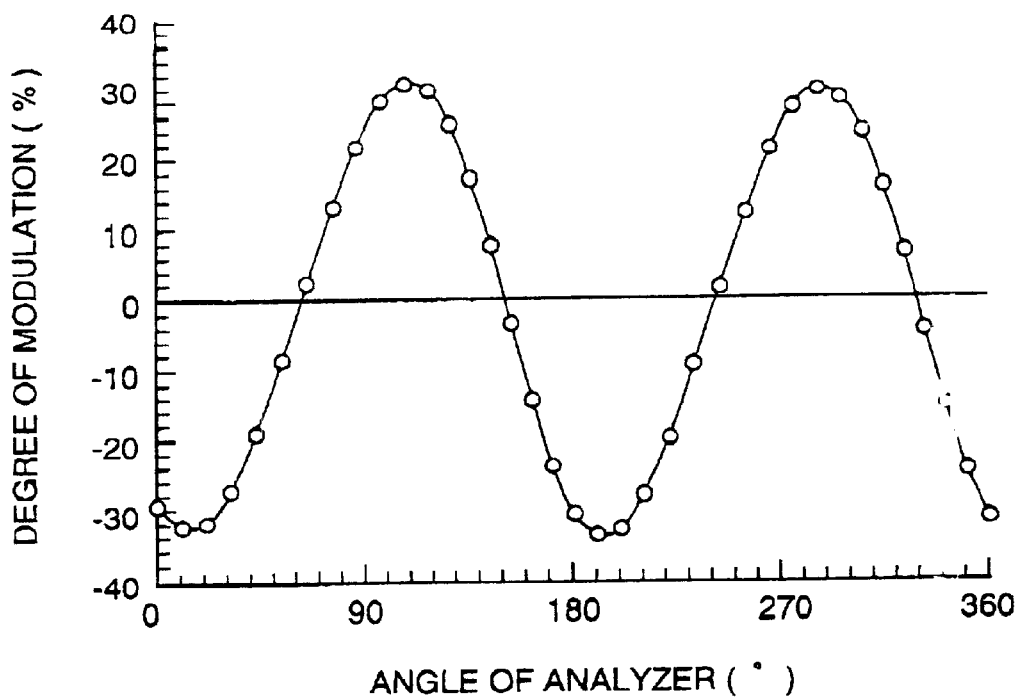
FIG. 3 is a graph showing an experimental result using a first embodiment of a BSO element in accordance with the present invention.

Next, an experiment was conducted using the sensor structure shown in FIG. 1 and applying DC +500V to the BSO element 4a and DC −500V to the BSO element 4b. As the result, the relationship between the degree of modulation and the angle of analyzer became as shown in FIG. 3. In this experimental result, the maximum value of the degree of modulation approximately 30% is shown at the angle of analyzer δ=approximately 10°. Comparing with the result of FIG. 2, it can be understood that in the optical-voltage sensor of the present embodiment, the measurement sensitivity is approximately 3 times as high as that of FIG. 2 at the angle of analyzer δ=0°, and the maximum value of the measurement sensitivity is approximately 1.5 times as high as that of FIG. 2.

Embodiment 2

Figure 4:
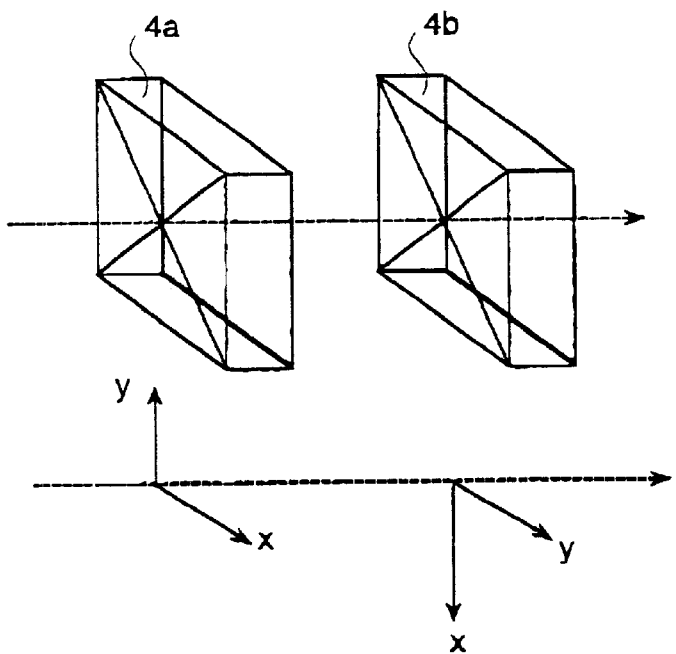
FIG. 4 is a diagram showing the structure of the main portion of a second embodiment of an optical-voltage sensor in accordance with the present invention.

A second embodiment of the present invention will be described below, referring to FIG. 4. In the present embodiment, two electro-optical elements 4a, 4b are arranged adjacent to each other along a transmitting direction of light. Further, the electro-optical elements 4a, 4b are arranged so that the crystal orientations are rotated by 90° (with an angle difference of 90°) in a plane perpendicular to the transmitting direction of the light. A voltage to be measured is applied to the electro-optical elements 4a, 4b at a time with an equal polarity from a power supply, which is not shown in the fugure. Similarly to the case of FIG. 1, the present embodiment also comprises a light source 1, a polarizer 2, a ¼ wavelength plate 3, an analyzer 5, and an O/E converting part 6, which are not shown in the figure, and the two electro-optical elements 4a, 4b are arranged between the ¼ wavelength plate 3 and the analyzer 5.

In the structure described above, the same effect as that of Embodiment 1 can be also obtained because the polarities of the Pockels effect are inverse to each other.

The present embodiment has effects that there is no need to thinning the thickness of the crystal because the present embodiment is an optical-voltage sensor using an electro-optical crystal having the optical rotatory power, and that the sensitivity of measuring optical-voltage can be increased with the simple structure by using the elements in which the crystal orientation agrees with the working surface. Particularly, the present embodiment is advantageous in that high sensitivity can be attained with the angle of analyzer δ=0°, and has an effect that the sensitivity can be further improved by laminating a plurality of groups of electro-optical elements, the group of electro-optical elements being composed of two electro-optical elements.

Embodiment 3

Figure 5:
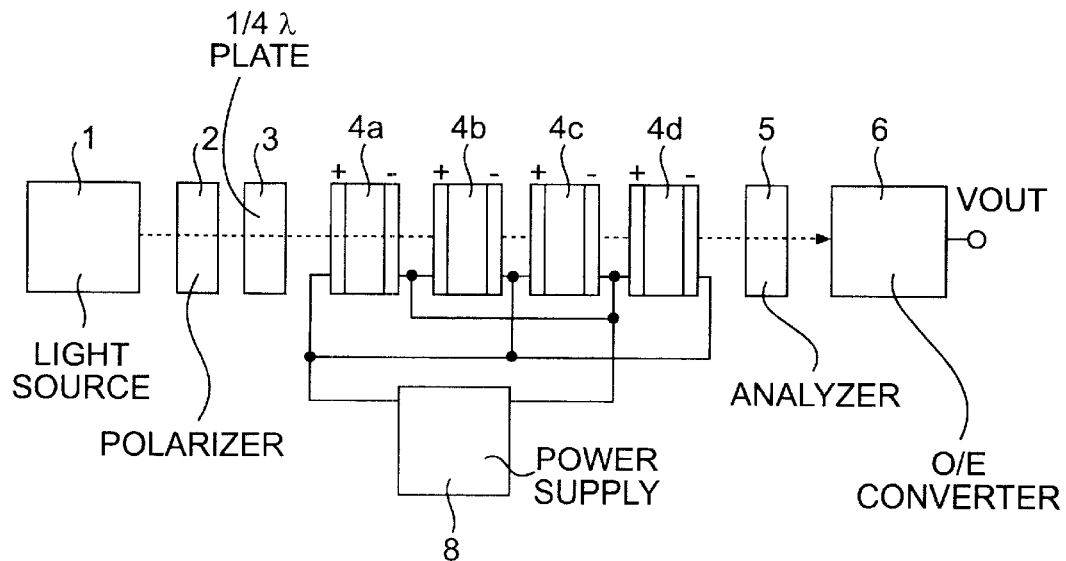
FIG. 5 is a schematic diagram showing the structure of a third embodiment of an optical-voltage sensor in accordance with the present invention.

A third embodiment of the present invention will be described below, referring to FIG. 5. In the present embodiment, two electro-optical elements 4a, 4b compose one group, and the other group of electro-optical elements 4c, 4d having the same structure as the one group is added to the optical-voltage sensor. These electro-optical elements 4a, 4b, 4c and 4d are arranged between the ¼ wavelength plate 3 and the analyzer 5. A voltage to be measured is applied to each of the electro-optical elements 4a, 4b, 4c and 4d at a time with polarities opposite to each other with respect to the adjacent electro-optical element from a power supply 8. For example, referring to FIG. 5, the positive voltage is applied to the transparent electrode in the left-hand side of the electro-optical element 4a and the negative voltage is applied to the transparent electrode in the right-hand side of the electro-optical element 4a, the negative voltage is applied to the transparent electrode in the left-hand side of the electro-optical element 4b and the positive voltage is applied to the transparent electrode in the right-hand side of the electro-optical element 4b, the positive voltage is applied to the transparent electrode in the left-hand side of the electro-optical element 4c and the negative voltage is applied to the transparent electrode in the right-hand side of the electro-optical element 4c, and the negative voltage is applied to the transparent electrode in the left-hand side of the electro-optical element 4d and the positive voltage is applied to the transparent electrode in the right-hand side of the electro-optical element 4d.

The above-mentioned structure can be designed so that the light passed through the electro-optical elements 4a, 4b is in the maximum degree of modulation at the angle of analyzer δ=0°, and the light passed through the electro-optical elements 4a, 4b can be further modulated by the electro-optical elements 4c, 4d in the next stage. Therefore, in the present embodiment, the degree of modulation becomes twice as large as the degree of modulation in the case of two elements, at maximum, even if each of the elements has the optical rotatory power. Further, since the angle of analyzer δ=0° agrees with the crystal orientation, the crystal orientation of each of the electro-optical elements does not need to be shifted.

Since the purpose of the optical-voltage sensor is to measure an applied voltage, the optical-voltage sensor is practically wired so that a voltage is applied to a plurality of elements from a single power supply, as the present embodiment. Therein, the Pockels effect is made in the inverse polarity by alternatively applying the inverse polar voltage to the elements in the first embodiment and the present embodiment, and accordingly a specific effect that no insulator is necessary between the elements can be expected. Furthermore, since the voltage in the same polarity is applied to the transparent electrodes opposite to each other in regard to the adjacent electro-optical elements of the present embodiment, the present embodiment also has an effect that there is no need to place any insulator between the transparent electrodes.

As having been described above, according to the present invention, an optical-voltage sensor simple in structure and high in measurement sensitivity can be obtained by utilizing the natural optical rotatory power by composing one group of two electro-optical elements.

Further, according to the present invention, the optical-voltage sensor can be designed and fabricated so that the degree of modulation is maximized in the angle of analyzer. As a result, when a plurality of electro-optical elements are laminated, the crystal orientation of each of the electro-optical elements is not necessary to be rotated inside the sensor.

What is claimed is:

1. An optical-voltage sensor comprising a polarizer for converting incident light into linearly polarized light; a ¼ wavelength plate for converting said linearly polarized light into circular polarized light; electro-optical elements having front and back surfaces with respect to a transmitting direction of said circularly polarized light and which transmits said circular polarized light therethrough and performs phase modulation of said circularly polarized light corresponding to a voltage applied to transparent electrodes attached to the front and back surfaces of the electro-optical elements; and an analyzer for sensing said circularly polarized light transmitted through said electro-optical elements, wherein two of said electro-optical elements are arranged adjacently to each other along the transmitting direction of the light, and a voltage to be measured is applied to each of said two electro-optical elements, wherein the voltage applied to one of said two electro-optical elements is of opposite polarity to the voltage applied to the other of said two electro-optical elements.

2. The optical-voltage sensor according to claim 1, wherein each of said two electro-optical elements is formed so that its thickness in the transmitting direction of the light corresponds to an angle of natural optical rotatory power larger than 45 degrees.

* * * * *